United States Patent
Haddad et al.

(10) Patent No.: US 6,653,189 B1
(45) Date of Patent: *Nov. 25, 2003

(54) SOURCE SIDE BORON IMPLANT AND DRAIN SIDE MDD IMPLANT FOR DEEP SUB 0.18 MICRON FLASH MEMORY

(75) Inventors: Sameer Haddad, San Jose, CA (US); Yue-song He, San Jose, CA (US); Timothy Thurgate, Sunnyvale, CA (US); Chi Chang, Redwood City, CA (US); Mark W. Randolph, San Jose, CA (US); Ngaching Wong, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 20 days.

This patent is subject to a terminal disclaimer.

(21) Appl. No.: 09/699,711

(22) Filed: Oct. 30, 2000

(51) Int. Cl.$^7$ .............................................. H01L 21/336
(52) U.S. Cl. .................... 438/258; 438/201; 438/369; 438/373
(58) Field of Search ................... 438/258, 201, 438/211, 257, 266, 260, 262, 263, 264, 594, 369, 373, 519, 527; 257/315, 316

(56) References Cited

U.S. PATENT DOCUMENTS

| | | | |
|---|---|---|---|
| 5,429,970 A | 7/1995 | Hong | 437/43 |
| 5,518,942 A * | 5/1996 | Shrivastava | 437/43 |
| 5,589,413 A | 12/1996 | Sung et al. | 437/43 |
| 5,592,003 A | 1/1997 | Sato et al. | 257/322 |
| 5,668,034 A | 9/1997 | Sery et al. | 438/266 |
| 5,672,533 A | 9/1997 | Arima et al. | 437/52 |
| 5,831,304 A | 11/1998 | Hara | 257/316 |
| 5,882,970 A | 3/1999 | Lin et al. | 438/264 |
| 5,888,870 A | 3/1999 | Gardner et al. | 438/261 |
| 5,920,776 A | 7/1999 | Fratin et al. | 438/257 |
| 5,933,729 A | 8/1999 | Chan | 438/257 |
| 6,060,357 A | 5/2000 | Lee | 438/257 |
| 6,163,482 A * | 12/2000 | Chi | 365/185.18 |
| 6,180,456 B1 * | 1/2001 | Lam et al. | 438/258 |
| 6,274,901 B1 * | 8/2001 | Odake et al. | 257/315 |
| 6,326,252 B1 * | 12/2001 | Kim et al. | 438/199 |
| 6,524,914 B1 * | 2/2003 | He et al. | 438/264 |

FOREIGN PATENT DOCUMENTS

| | | | |
|---|---|---|---|
| EP | 0905790 | 3/1999 | H01L/29/788 |
| JP | 6291330 | 10/1994 | H01L/29/788 |

OTHER PUBLICATIONS

Stephen A. Campbell, The Science and Engineering of Microelectronic Fabrication, Oxford University Press, Inc. 1996, p. 153.*

Donald A. Neamen, Semiconductor Physics & Devices, the McGraw–Hill Companies, Inc. 1992 and 1997, pp. 495–496.*

* cited by examiner

Primary Examiner—Steven Loke
Assistant Examiner—Douglas W. Owens
(74) Attorney, Agent, or Firm—Amin & Turocy, LLP

(57) ABSTRACT

One aspect of the present invention relates to a method of making a flash memory cell, involving the steps of providing a substrate having a flash memory cell thereon; forming a self-aligned source mask over the substrate, the self aligned source mask having openings corresponding to source lines; implanting a source dopant of a first type in the substrate through the openings in the self-aligned source mask corresponding to source lines; removing the self-aligned source mask from the substrate; forming a MDD mask over the substrate, the MDD mask covering the source lines and having openings corresponding to drain lines; and implanting a medium dosage drain implant of a second type to form a drain region in the substrate adjacent the flash memory cell.

18 Claims, 3 Drawing Sheets

SOURCE SIDE BORON IMPLANT AND DRAIN SIDE MDD IMPLANT FOR DEEP SUB 0.18 MICRON FLASH MEMORY

TECHNICAL FIELD

The present invention generally relates to improved methods of making flash memory devices such as EEPROMs. More particularly, the present invention relates to non-volatile flash memory devices with source and drain doping that differ having reduced short channel effects.

BACKGROUND ART

Semiconductor devices typically include multiple individual components formed on or within a substrate. Such devices often comprise a high density section and a low density section. For example, as illustrated in prior art FIG. 1a, a memory device such as a flash memory 10 comprises one or more high density core regions 11 and a low density peripheral portion 12 on a single substrate 13. The high density core regions 11 typically consist of at least one M×N array of individually addressable, substantially identical floating-gate type memory cells and the low density peripheral portion 12 typically includes input/output (I/O) circuitry and circuitry for selectively addressing the individual cells (such as decoders for connecting the source, gate and drain of selected cells to predetermined voltages or impedances to effect designated operations of the cell such as programming, reading or erasing).

Prior art FIG. 1b represents a fragmentary cross section diagram of a typical memory cell 14 in the core region 11 of prior art FIG. 1a. Such a cell 14 typically includes the source 14b, the drain 14a and a channel 15 in a substrate or P-well 16; and the stacked gate structure 14c overlying the channel 15. The stacked gate 14c further includes a thin gate dielectric layer 17a (commonly referred to as the tunnel oxide) formed on the surface of the P-well 16. The stacked gate 14c also includes a polysilicon floating gate 17b which overlies the tunnel oxide 17a and an interpoly dielectric layer 17c overlies the floating gate 17b. The interpoly dielectric layer 17c is often a multilayer insulator such as an oxide-nitride-oxide (ONO) layer having two oxide layers sandwiching a nitride layer. Lastly, a polysilicon control gate 17d overlies the interpoly dielectric layer 17c. Each stacked gate 14c is coupled to a word line (WL0, WL1, . . . , WLn) while each drain of the drain select transistors are coupled to a bit line (BL0, BL1, . . . , BLn). The channel 15 of the cell 14 conducts current between the source 14b and the drain 14a in accordance with an electric field developed in the channel 15 by the stacked gate structure 14c. Using peripheral decoder and control circuitry, each memory cell 14 can be addressed for programming, reading or erasing functions.

In the semiconductor industry, there is a continuing trend toward higher device densities to increase circuit speed and packing densities. To achieve these high densities there has been and continues to be efforts toward scaling down the device dimensions on semiconductor wafers. Scaling in this sense refers to proportionately shrinking device structures and circuit dimensions to produce a smaller device that functions according to the parameters as a larger unscaled device. In order to accomplish such scaling, smaller and smaller features sizes are required. This includes the width and spacing of features including gate length.

The requirement of small features raises numerous concerns associated with flash memory devices, especially with regard to consistent performance and reliability. For example, as feature size decreases, such as a decrease in gate length, variations in size (such as gate length) increase. That is, it is difficult to maintain critical dimension control as the size decreases. As gate length decreases, the possibility of short channel effects increases. Nitrided tunnel oxide layers in some instances also contribute to increases in short channel effects.

A short channel effect occurs as the length between the source and drain is reduced. Short channel effects include Vt rolloff (Vt is the threshold voltage), drain induced barrier lowering (DIBL), and excess column leakage. DIBL is often caused by the application of drain voltage in short channel devices. In other words, the drain voltage causes the surface potential to be lowered.

In view of the aforementioned concerns and problems, there is an unmet need for making flash memory cells of improved quality with increased integration, and especially for sub 0.18 μm flash memory cells having reduced short channel effects.

SUMMARY OF THE INVENTION

As a result of the present invention, non-volatile flash memory device fabrication is improved thereby producing devices having improved reliability. By employing the methods of the present invention which provide for different channel doping for the source and drain, the formation of a flash memory device on the sub 0.18 μm scale having reduced short channel effects is facilitated. Specifically, the present invention enable further scaling of non-volatile flash memory devices while minimizing and/or eliminating undesirable short channel effects, including at least one of Vt rolloff, high DIBL, excess column leakage, and variations in gate length across the product array. Undesirable short channel effects caused by the use of nitrided tunnel oxide layers are also minimized.

One aspect of the present invention relates to a method of making a flash memory cell, involving the steps of providing a substrate having a flash memory cell thereon; forming a self-aligned source mask over the substrate, the self aligned source mask having openings corresponding to source lines; implanting a source dopant of a first type in the substrate through the openings in the self-aligned source mask corresponding to source lines; removing the self-aligned source mask from the substrate; forming a MDD mask over the substrate, the MDD mask covering the source lines and having openings corresponding to drain lines; and implanting a medium dosage drain implant of a second type to form a drain region in the substrate adjacent the flash memory cell.

Another aspect of the present invention relates to a method of making a flash memory cell, involving the steps of providing a substrate having a flash memory cell thereon; forming a self-aligned source mask over the substrate, the self aligned source mask having openings corresponding to source lines; implanting a source dopant of a first type in the substrate through the openings in the self-aligned source mask corresponding to source lines to form a source region in the substrate adjacent the flash memory cell, wherein the source dopant is implanted at an energy from about 10 keV to about 40 keV to a dosage from about $1\times10^{13}$ atoms/cm$^2$ to about $5\times10^{14}$ atoms/cm$^2$; removing the self-aligned source mask from the substrate; forming a second mask over the substrate, the second mask having openings corresponding to drain lines; implanting a medium dosage drain implant of a second type to form a drain region in the substrate adjacent the flash memory cell, wherein the medium dosage drain implant is implanted at an energy from about 30 keV to about 60 keV to a dosage from about $5 \times 10^{13}$ atoms/cm$^2$ to about $5 \times 10^{15}$ atoms/cm$^2$; removing the second mask from the substrate; and heating the substrate at a temperature from about 300° C. to about 1,100° C.

Yet another aspect of the present invention relates to a method of making a flash memory cell, involving the steps of providing a substrate having a flash memory cell thereon; forming a self-aligned source mask over the substrate, the self aligned source mask having openings corresponding to source lines; implanting a source dopant of a first type in the substrate through the openings in the self-aligned source mask corresponding to source lines, wherein the source dopant is implanted at an energy from about 10 keV to about 40 keV to a dosage from about $1 \times 10^{13}$ atoms/cm$^2$ to about $5 \times 10^{14}$ atoms/cm$^2$; removing the self-aligned source mask from the substrate; forming a second mask over the substrate, the second mask having openings corresponding to drain lines; implanting a medium dosage drain implant of a second type to form a drain region in the substrate adjacent the flash memory cell, wherein the medium dosage drain implant is implanted at an energy from about 30 keV to about 60 keV to a dosage from about $5 \times 10^{13}$ atoms/cm$^2$ to about $5 \times 10^{15}$ atoms/cm$^2$; and heating the substrate in an inert gas atmosphere at a temperature from about 400° C. to about 1,200° C.

DISCLOSURE OF INVENTION

Figure 1A:
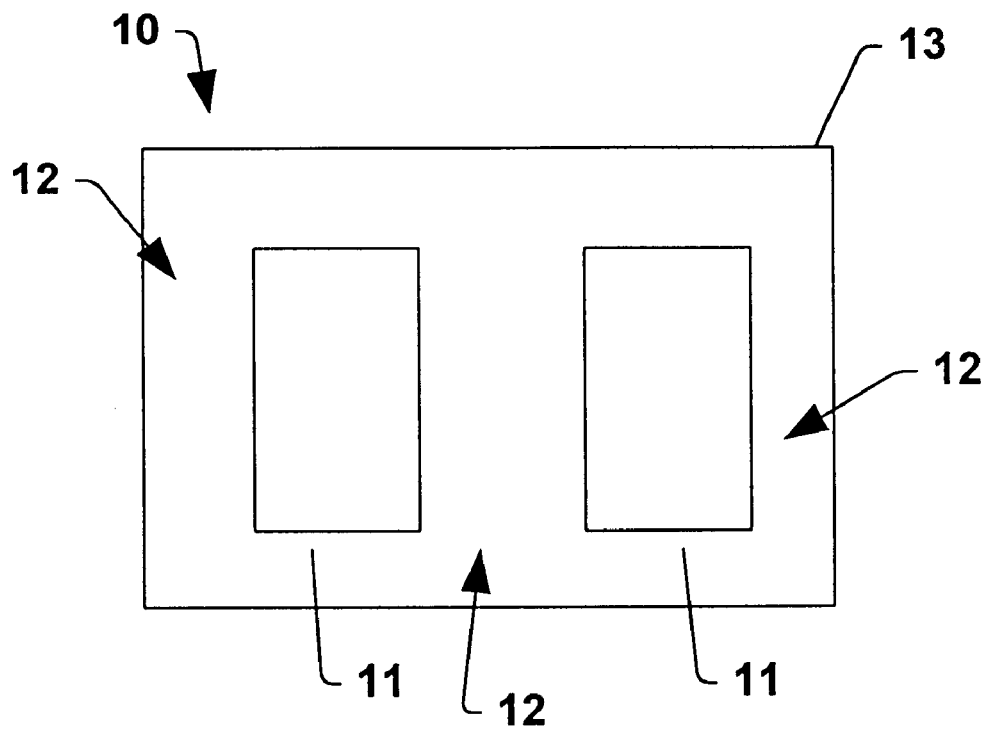
FIG. 1a is a plan view illustrating a prior art layout of a flash memory chip.
Figure 1B:
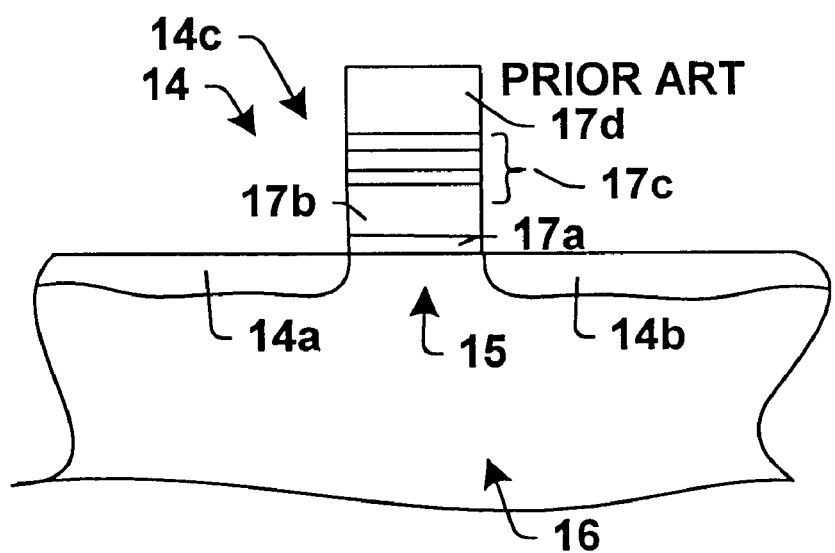
FIG. 1b is a fragmentary cross section illustrating a prior art stacked gate flash memory cell.

The present invention involves making non-volatile flash memory devices with different channel doping for the source and drain. As a result, non-volatile flash memory devices having reduced short channel effects are provided. The lateral diffusion after source side implant heating steps are unnecessary when making non-volatile flash memory devices in accordance with the present invention. The present invention is described with reference to the drawings wherein like reference numerals are used to refer to like elements throughout.

The present invention may be understood and its advantages appreciated in conjunction with the process of FIGS. 2–7, wherein like numerals represent like features throughout.

An improved semiconductor manufacturing process flow illustrating the how to make the flash memory device is described in detail in conjunction with FIGS. 2–7. This process highlights the activity in the core region of the substrate, which is where the stacked memory cells and the select gate transistors are subsequently positioned. In this connection, while the substrate contains two regions; namely, the periphery region and the core region; the core region of the substrate contains two areas; namely, the stacked memory cell area.

Figure 2:
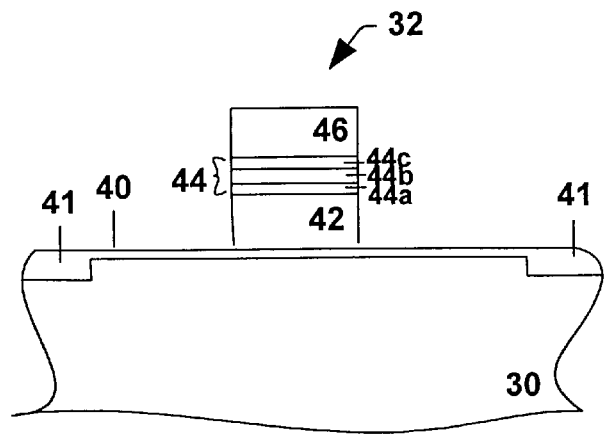
FIG. 2 is a cross sectional illustration of one aspect of a making a non-volatile flash memory device in accordance with the present invention.

Referring to FIG. 2, a substrate 30 having a stacked memory cell 32 and shallow trench isolation regions 41 is provided. The stacked memory cell 32 is positioned in the stacked memory cell area of the core region of the substrate 30. The shallow trench isolation regions 41 contain an insulation material such as silicon dioxide or silicon nitride. The substrate 30 having a stacked memory cell 32 may be provided as follows, although any suitable process flow may be employed.

The substrate 30 is typically a silicon substrate optionally with various elements, regions and/or layers thereover; including metal layers, barrier layers, dielectric layers, device structures, active regions such as active silicon regions or areas, active elements and passive elements including P wells, N wells, additional polysilicon gates, wordlines, source regions, drain regions, bit lines, bases, emitters, collectors, conductive lines, conductive plugs, etc. A first oxide layer 40 is provided over at least a portion of the substrate 30 or over the entire substrate 30 using any suitable means, such as dry oxidation, wet oxidation, rapid thermal oxidation, or chemical vapor deposition (CVD).

Optionally, the first oxide layer 40 may be nitrided using a nitridation process. In some instances, employing a nitrided first oxide layer 40 contributes to short channel effects. The present invention minimizes these effects and thus enables the use of nitrided first oxide layers 40 in flash memory devices (nitrided tunnel oxide layers). The nitrided first oxide layer 40 also contributes to improved tunnel oxide reliability.

A first poly layer 42 is provided using any suitable process, such as an in situ doping process, over the first oxide layer 40. The first poly layer 42 is polysilicon or doped amorphous silicon. Polysilicon is formed using CVD techniques. The doped amorphous silicon layer is made using an in situ doping process. The first doped amorphous silicon layer 42 (also termed Poly 1) subsequently forms the floating gate of the stacked memory cell. The dopant employed to make the thin first doped amorphous silicon layer is at least one of phosphorus and arsenic.

A dielectric layer 44 is provided over at least a portion of the Poly 1 layer 42 using any suitable means. The dielectric layer 44 is preferably an ONO multilayer dielectric containing three layers; namely an oxide layer 44a, a nitride layer 44b, and another oxide layer 44c. The dielectric layer subsequently forms the interpoly dielectric layer of the stacked memory cell 32.

A second poly layer 46 is provided over at least a portion of the substrate using any suitable means. The second poly layer 46 subsequently forms the control gate of the stacked memory cell (also termed Poly 2). The second poly layer 46 is made of polysilicon or doped amorphous silicon.

Although not shown, additional layers may be provided using any suitable means over portions of the Poly 2 layer. For example, a cobalt or tungsten silicide layer may be provided over at least a portion of the Poly 2 layer 46, and a silicon oxynitride layer may be provided over the tungsten silicide layer.

Various suitable masking and etching steps are employed to form memory cells in the stacked memory cell area of the core region of the structure (the gates are defined). One or more photoresists and/or hard masks and/or the partially formed stacked memory cell (not shown) may be used as the masks. Etching is typically conducted layer by layer to maximize etch selectivity. For example, the Poly 2 layer is etched using an etch chemistry different from etching the oxide layers. Although only one stacked flash memory cell 32 is shown, a plurality of cells are formed in the core region of the structure. The structure is optionally cleaned before proceeding. The stacked flash memory cell 32 (and the SONOS type memory cell of FIG. 7) may have a width (gate length) of about 0.18 $\mu$m or smaller.

Figure 3:
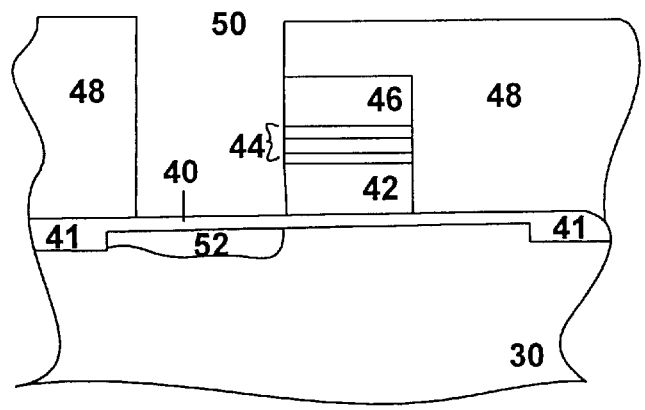
FIG. 3 is a cross sectional illustration of another aspect of a making a non-volatile flash memory device in accordance with the present invention.

Referring to FIG. 3, a mask is formed over the structure leaving exposed the Vss line. Forming the mask 48 involves patterning a self-aligned source (SAS) mask using a photoresist or hard mask over the structure leaving the source line open 50 to further processing. That is, mask 48 has openings 50 over the substrate 30 through which the subsequently formed source lines are formed.

After the mask is formed, a source dopant such as boron is implanted through openings 50 in the mask 48 to the exposed source line (to the exposed portion of substrate 30) forming the source side implant 52. The source dopant may partially diffuse underneath the Poly 1 or floating gate. The source dopant may be p type or n type, but it is preferably p type.

In one embodiment, the source dopant is implanted at an energy from about 10 keV to about 40 keV to a dosage from about $1 \times 10^{13}$ atoms/cm$^2$ to about $5 \times 10^{14}$ atoms/cm$^2$. In another embodiment, the source dopant is implanted at an energy from about 15 keV to about 30 keV to a dosage from about $5 \times 10^{13}$ atoms/cm$^2$ to about $2 \times 10^{14}$ atoms/cm$^2$. In yet another embodiment, the source dopant is implanted at an energy from about 15 keV to about 25 keV to a dosage from about $5 \times 10^{13}$ atoms/cm$^2$ to about $2 \times 10^{14}$ atoms/cm$^2$. In place of or in addition to boron, phosphorus may be implanted (at the same energies and dosage levels).

Figure 4:
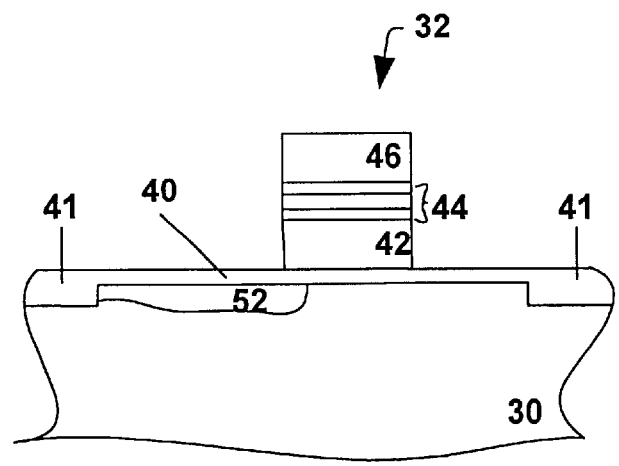
FIG. 4 is a cross sectional illustration of yet another aspect of a making a non-volatile flash memory device in accordance with the present invention.

Referring to FIG. 4, the source dopant implantation is followed by removing the mask 48, and optionally cleaning the structure. It is noted that a heat treatment to promote diffusion of boron 52 under the gates (under Poly 1 gate 42) is not necessary.

Figure 5:
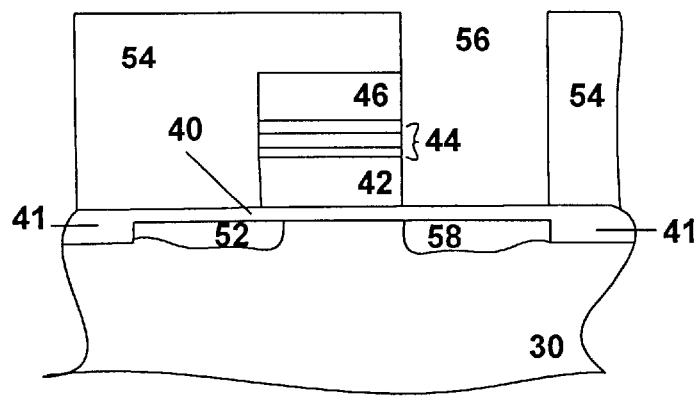
FIG. 5 is a cross sectional illustration of still yet another aspect of a making a non-volatile stacked flash memory device in accordance with the present invention.

Referring to FIG. 5, a mask 54 is formed over the structure leaving exposed the drain regions of the memory cells 32 and a medium dosage drain (MDD) implant is performed forming drain 58 regions. Forming the mask 54 involves patterning a MDD mask using a photoresist or hard mask over the structure leaving the drain regions open 56 to further processing. That is, mask 54 has openings 56 over the substrate 30 through which the subsequently formed drains are formed. The MDD mask covers the entire periphery and portions of the core region that do not correspond to the drain regions. In other words, the MDD mask covers the source lines.

Figure 6:
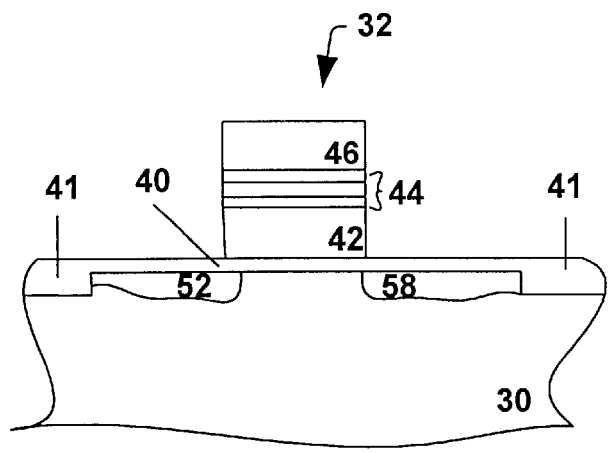
FIG. 6 is a cross sectional illustration of one aspect of a non-volatile stacked flash memory device in accordance with the present invention.

The MDD implant facilitates the formation of a heavy junction. The dopant may be p type or n type, but it is preferably n type. Specifically, the dopant is preferably an n+ implant, such as arsenic or phosphorus. The MDD implant dopant is preferably opposite that of the source dopant; that is, the MDD implant is an n type when the source dopant is a p type and the MDD implant is a p type when the source dopant is an n type. In one embodiment, the MDD implant is performed at an energy from about 30 keV to about 60 keV to a dosage from about $5 \times 10^{13}$ atoms/cm$^2$ to about $5 \times 10^{15}$ atoms/cm$^2$. In another embodiment, the MDD implant is performed at an energy from about 35 keV to about 55 keV to a dosage from about $1 \times 10^{14}$ atoms/cm$^2$ to about $1 \times 10^{15}$ atoms/cm$^2$. Referring to FIG. 6, the MDD drain side implantation is followed by removing the mask 54, and optionally cleaning the structure. A heat treatment to promote diffusion of boron 52 and the MDD implant 58 under the gates (under Poly 1 gate 42) may be performed. In one embodiment, the heat treatment involves heating the structure under an inert gas atmosphere at a temperature from about 400° C. to about 1,200° C. for a time from about 1 second to 5 minutes. Inert gases include nitrogen, helium, neon, argon, krypton, and xenon. In another embodiment, the heat treatment involves heating the structure under a temperature from about 500° C. to about 1,100° C. for a time from about 10 seconds to 3 minutes. In yet another embodiment, the heat treatment involves heating the structure under a temperature from about 600° C. to about 1,000° C. for a time from about 15 seconds to 2 minutes.

Figure 7:
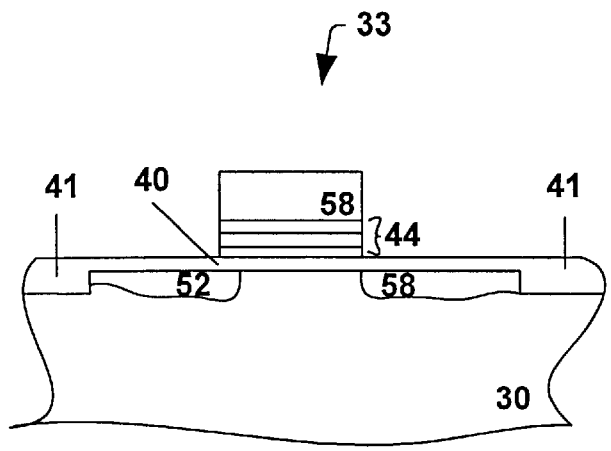
FIG. 7 is a cross sectional illustration of one aspect of a non-volatile SONOS flash memory device in accordance with the present invention.

The present invention is also applicable to SONOS (Silicon Oxide Nitride Oxide Silicon) type memory devices. Referring to FIG. 7, a SONOS type memory device 33 is shown having the source side boron implant 52 and a MDD drain side implant 58 in accordance with the present invention. The SONOS type memory device 33 is processed in the same manner as stacked flash memory cell 32 in FIGS. 2–6. Thus, FIG. 7 is analogous to FIG. 6. The present invention is applicable to both NAND and NOR type memory configurations.

Although not shown, a series of mask and etch steps (such as self aligned etch steps) are employed to form select gate transistors in the core region, high voltage transistors and low voltage transistors in the periphery region, word lines, contacts, interconnections, an encapsulating oxide film, such as tetraethylorthosilicate (TEOS), borophosphotetraethylorthosilicate (BPTEOS), phosphosilicate glass (PSG), or borophosphosilicate glass (BPSG), and the like. These steps may be conducted during and/or after formation of the memory cells in accordance with the present invention. These steps are known in the art.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of making a flash memory cell, comprising:
providing a substrate having a flash memory cell thereon, the flash memory cell has a gate length of about 0.18 $\mu$or less;
forming a self-aligned source mask over the substrate, the self aligned source mask having openings corresponding to source lines;

implanting a source dopant of a p type boron in the substrate through the openings in the self-aligned source mask corresponding to source lines, wherein the source dopant is implanted at an energy from about 15 keV to about 30 keV to a dosage from about $1 \times 10^{13}$ atoms/cm$^2$ to about $5 \times 10^{14}$ atoms/cm$^2$, with the proviso that the substrate is not heated after implanting the source dopant and before implanting a MDD implant;

removing the self-aligned source mask from the substrate;

forming a MDD mask over the substrate, the MDD mask covering the source lines and having openings corresponding to drain lines; and implanting a medium dosage drain implant of an n type to form a drain region in the substrate adjacent the flash memory cell, wherein the p type boron is different from the n type, and the medium dosage drain implant is implanted at an energy from about 35 keV to about 60 keV to a dosage from about $5 \times 10^{13}$ atoms/cm$^2$ to about $5 \times 10^{15}$ atoms/cm$^2$.

2. The method according to claim 1, further comprising heat treating the substrate after implanting the medium dosage drain implant.

3. The method according to claim 1, wherein the source dopant is implanted at a dosage from about $5 \times 10^{13}$ atoms/cm$^2$ to about $2 \times 10^{14}$ atoms/cm$^2$.

4. The method according to claim 1, wherein the source dopant consists essentially of boron.

5. The method according to claim 1, wherein the medium dosage drain implant is implanted at a dosage from about $1 \times 10^{14}$ atoms/cm$^2$ to about $1 \times 10^{15}$ atoms/cm$^2$.

6. The method according to claim 1, wherein the medium dosage drain implant consists essentially of arsenic or phosphorus.

7. The method according to claim 1, wherein the flash memory cell comprises a first poly layer, an ONO multi-layer dielectric over the first poly layer, and a second poly layer over the ONO multi-layer dielectric.

8. The method according to claim 1, wherein the flash memory cell comprises an ONO charge trapping layer, and a poly layer over the ONO charge trapping layer.

9. A method of making a flash memory cell, comprising:

providing a substrate having a flash memory cell thereon, the flash memory cell has a gate length of about 0.18 $\mu$ or less;

forming a self-aligned source mask over the substrate, the self aligned source mask having openings corresponding to source lines;

implanting a source dopant of a p type boron in the substrate through the openings in the self-aligned source mask corresponding to source lines to form a source region in the substrate adjacent the flash memory cell, wherein the source dopant is implanted at an energy from about 10 keV to about 30 keV to a dosage from about $1 \times 10^{13}$ atoms/cm$^2$ to about $5 \times 10^{14}$ atoms/cm$^2$, with the proviso that the substrate is not heated after implanting the source dopant and before implanting a MDD implant;

removing the self-aligned source mask from the substrate;

forming a second mask over the substrate, the second mask having openings corresponding to drain lines;

implanting a medium dosage drain implant of an n type to form a drain region in the substrate adjacent the flash memory cell, wherein the medium dosage drain implant is implanted at an energy from about 35 keV to about 60 keV to a dosage from about $5 \times 10^{13}$ atoms/cm$^2$ to about $5 \times 10^{15}$ atoms/cm$^2$;

removing the second mask from the substrate; and heating the substrate at a temperature from about 300° C. to about 1,100° C.

10. The method according to claim 9, wherein the source dopant consists essentially of boron.

11. The method according to claim 9, wherein the medium dosage drain implant consists essentially of arsenic or phosphorus.

12. The method according to claim 9, wherein the flash memory cell comprises a nitride tunnel oxide layer.

13. The method according to claim 9, wherein the flash memory cell comprises a first poly layer and a second poly layer.

14. A method of making a flash memory cell, comprising:

providing a substrate having a flash memory cell thereon, the flash memory cell has a gate length of about 0.18 $\mu$ or less;

forming a self-aligned source mask over the substrate, the self aligned source mask having openings corresponding to source lines;

implanting a source dopant of a p type boron implant in the substrate through the openings in the self-aligned source mask corresponding to source lines, wherein the source dopant is implanted at an energy from about 10 keV to about 30 keV to a dosage from about $1 \times 10^{13}$ atoms/cm$^2$ to about $5 \times 10^{14}$ atoms/cm$^2$, with the proviso that the substrate is not heated after implanting the source dopant and before implanting a MDD implant;

removing the self-aligned source mask from the substrate;

forming a second mask over the substrate, the second mask having openings corresponding to drain lines;

implanting a medium dosage drain implant of an n type arsenic or phosphorus implant to form a drain region in the substrate adjacent the flash memory cell, wherein the medium dosage drain implant is implanted at an energy from about 35 keV to about 60 keV to a dosage from about $5 \times 10^{13}$ atoms/cm$^2$ to about $5 \times 10^{15}$ atoms/cm$^2$; and heating the substrate in an inert gas atmosphere at a temperature from about 400° C. to about 1,200° C.

15. The method according to claim 14, wherein the source dopant consists essentially of boron.

16. The method according to claim 14, wherein the medium dosage drain implant consists essentially of arsenic or phosphorus.

17. The method according to claim 14, wherein the flash memory cell comprises a nitride tunnel oxide layer.

18. The method according to claim 14, wherein the flash memory cell is a SONOS type memory cell.

* * * * *